(12) United States Patent
Böhm et al.

(10) Patent No.: US 6,618,306 B2
(45) Date of Patent: Sep. 9, 2003

(54) SEMICONDUCTOR MEMORY DEVICE HAVING ROW AND COLUMN REDUNDANCY CIRCUIT AND METHOD OF MANUFACTURING THE CIRCUIT

(75) Inventors: Thomas Böhm, Zorneding (DE); Helmut Kandolf, München (DE); Stefan Lammers, South Burlington, VT (US); Zoltan Manyoki, Kirchhundern (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/237,410

(22) Filed: Sep. 9, 2002

(65) Prior Publication Data
US 2003/0039157 A1 Feb. 27, 2003

Related U.S. Application Data

(63) Continuation of application No. PCT/EP01/01939, filed on Feb. 21, 2001.

(30) Foreign Application Priority Data

Mar. 8, 2000 (DE) .......................................... 100 11 180

(51) Int. Cl.$^7$ ............................................. G11C 29/00
(52) U.S. Cl. .................. 365/201; 365/230.03
(58) Field of Search ............................. 365/201, 230.03

(56) References Cited

U.S. PATENT DOCUMENTS

| | | | | |
|---|---|---|---|---|
| 5,617,364 A | * | 4/1997 | Hatakeyama | ............... 365/200 |
| 5,732,029 A | | 3/1998 | Lee et al. | |
| 5,808,948 A | | 9/1998 | Kim et al. | |
| 5,848,003 A | * | 12/1998 | Nishikawa | ................... 365/200 |

FOREIGN PATENT DOCUMENTS

EP        0 637 036 A2     2/1995

* cited by examiner

Primary Examiner—Hoai Ho
(74) Attorney, Agent, or Firm—Laurence A. Greenberg; Werner H. Stemer; Gregory L. Mayback

(57) ABSTRACT

A digital circuit configuration includes a memory matrix having M rows and N columns and P<M additional rows and Q<N additional columns, and an addressing device whose address connection contacts are sufficient precisely for addressing the M rows and N columns. To address the additional rows and columns as well, particularly, for test purposes, only a single control bit connection contact is provided with a changeover device responding to control bits from the control bit connection contact and from dedicated address connection contacts to associate applied address bits either with addressing of the M rows and N columns or the additional rows and columns. The numbers P and Q are chosen such that the addressing of P elements requires at least two bits fewer than the addressing of M elements, and such that the addressing of Q elements requires at least two bits fewer than the addressing of N elements.

17 Claims, 4 Drawing Sheets

SEMICONDUCTOR MEMORY DEVICE HAVING ROW AND COLUMN REDUNDANCY CIRCUIT AND METHOD OF MANUFACTURING THE CIRCUIT

CROSS-REFERENCE TO RELATED APPLICATION

This application is a continuation of copending International Application No. PCT/EP01/01939, filed Feb. 21, 2001, which designated the United States and was not published in English.

BACKGROUND OF THE INVENTION

Field of the Invention

The invention relates to a circuit configuration having a matrix including memory cells and an addressing device, and a method for manufacturing the circuit.

In conventional digital information memories, also referred to as stores, the memory cells form a matrix including M rows and N columns. To select a memory cell for writing or reading, a row line associated with the row in question and a column line associated with the column in question are actuated. The selective actuation of the row lines, that is to say, the "addressing" of the matrix rows, is normally performed by a row address decoder having outputs individually connected to the row lines and inputs for receiving the bits of a digital row address. In a similar manner, a column address decoder performs the selective actuation of the column lines.

To select from X possibilities, a number of bits is required that is equal to ld(X), that is to say, equal to the base 2 logarithm (logarithm to the base 2) of X, or equal to the next highest integer if such an logarithm is not an integer logarithm. Normally, the numbers of rows and columns M and N in a memory matrix are, respectively, integer powers of the number 2 so that precisely Z=ld(M) bits are required for the row address and precisely S=ld(N) bits are required for the column address.

Following its manufacture, a memory circuit can contain faults in the memory matrix. To overcome such a problem, there exists a practice to test the memory matrix before the memory circuit is used further and to replace those rows and columns in which a fault has been found with a respective fault-free row or column before the memory circuit is used. To such an end, the circuit is equipped with "redundant" columns and rows, in addition to the "regular" M rows and N columns, during actual manufacture. A faulty regular row or column can be replaced with a fault-free redundant row or column using a laser. However, because it is also necessary to test the redundant rows/columns in advance to detect any faults, additional ways are required for addressing them. The address connection contacts provided for addressing the regular rows/columns are not adequate in such a case.

For additional bits that need to be applied for the purpose of addressing the redundant rows and columns, separate connection contacts need to be provided. Even if, as is usual, the number of redundant instances is no greater than the number of regular instances, two bits are required to make the 1-out-of-4 decision for the choice between the regular row lines and the redundant row lines and between the regular column lines and the redundant column lines.

If the row address and the column address are successively applied to a chip containing a memory matrix having M regular rows and N regular columns and the associated address decoding device, then the total number of address connection contacts on the chip need not be greater than Z=ld(M) or S=ld(N), depending on which number is the greater of the two. In such a case, the two additional bits for the 1-out-of-4 decision can naturally likewise be applied in succession, i.e., one together with the row address and the other together with the column address so that only one additional connection contact is required for selecting between "regular" and "redundant", as is disclosed from U.S. Pat. No. 5,732,029 to Lee et al. However, there are memory circuits that provide one address space for simultaneously applying both the row address and the column address; in such a case, addressing requires a number of Z+S address connection contacts, and the two supplementary bits for the aforementioned 1-out-of-4 decision need to be applied simultaneously, which would actually require two additional connection contacts.

Connection contacts need to have a large enough contact area to be able to attach the outwardly routed connecting wires. In the case of integrated circuits, the space taken up by these contact areas ("pads") is extremely large in comparison with the actual circuit components, and such a space requirement demands precious silicon area. In the present state of miniaturization of memory circuits, a pad on the integrated semiconductor chip takes up a space equivalent to the space required by approximately one thousand memory cells.

SUMMARY OF THE INVENTION

It is accordingly an object of the invention to provide a digital memory circuit and a method for manufacturing the circuit that overcomes the hereinafore-mentioned disadvantages of the heretofore-known devices and methods of this general type and that minimizes the number of connection contacts required for simultaneous row and column addressing in a memory circuit provided with an addressing device and having a memory matrix containing not only regular rows and columns but also additional instances of rows and columns.

With the foregoing and other objects in view, there is provided, in accordance with the invention, a digital circuit configuration, including an information memory having cells forming a memory matrix (50) with M rows, N columns, P additional rows, and Q additional columns, where P<M, Q<N, P has K≦(Z−2) bits for addressing P elements, and Q has L≦(S−2) bits for addressing Q elements, an addressing device having an address decoding device having inputs, an input circuit having address connection contacts for receiving externally applied row and column address bits, a number of the address connection contacts being equal to a sum Z+S, where Z is a number of bits required for addressing M elements and S is a number of bits required for addressing N elements, a control bit connection contact for receiving an externally applied first control bit, and a changeover device receiving the first control bit and second and third control bits respectively applied to two dedicated contacts of the address connection contacts, a device for transferring at least some of the applied address bits to the inputs of the address decoding device, and the changeover device, only when the first control bit has a given first binary value, setting a first operating state in which the address decoding device uses bits of all of the address connection contacts for addressing M selected rows and N selected columns in the memory matrix, and otherwise, depending on a given combination of values of the second and third control bits, selectively setting one of a second operating state, a third operating state, and a fourth operating state in which the address decoding device, respectively, uses bits from contacts of ones of the address connection contacts not dedicated to the second and third control bits for addressing M selected rows and a remaining set of Q columns, a remaining set of P rows and N selected columns, and a remaining set of P rows and a remaining set of Q columns.

The invention, thus, relates to a circuit configuration having a memory matrix that contains M regular rows and N regular columns and also has P additional rows and Q additional columns, and having an addressing device whose address connection contacts are sufficient precisely for simultaneously addressing the regular rows and columns. To be able to address the additional rows and columns as well, the invention additionally provides only a single control bit connection contact and a changeover device that responds to control bits from the control bit connection contact and from dedicated instances of the address connection contacts to associate applied address bits either with addressing of the regular rows and columns or with addressing of the additional rows and columns. To make such a configuration possible, the numbers P and Q are chosen such that the addressing of P elements requires at least two bits fewer than the addressing of M elements, and such that the addressing of Q elements requires at least two bits fewer than the addressing N elements.

By virtue of the invention, to address all of the rows and columns in the memory matrix, just a single additional control bit connection contact is needed besides the connection contacts required for simultaneously addressing just the regular rows and columns. The only condition is that the number of additional rows and of additional columns is smaller by a respective particular minimum than the number of regular rows and columns. The invention is based on the insight that, under such a condition, some of the address connection contacts required for addressing just the regular rows and columns can perform an alternative function when it comes to addressing the additional rows and columns.

Preferably, the number M of regular rows, the number N of regular columns, the number P of additional rows, and the number Q of additional columns are, respectively, an integer power of the natural number 2. Such a selection makes optimum use of the available address space (number of address connection contacts).

In accordance with another feature of the invention, at least one of the variables M, N, P, and Q are set according to the following relationships: $M=2^Z$, $N=2^S$, $P=2^K$, and $Q=2^L$.

The inventive circuit configuration whose memory matrix contains M regular rows and N regular columns and also additional rows and columns makes it possible to use a minimized number of connection contacts (pads) to provide a memory circuit having a fault-free memory space including M rows and N columns. With such a method, which represents one particular application of the invention, following manufacture of the circuit configuration, the three control bits are used to prompt the changeover device to set the four inventive operating states in succession and, hence, to select four different regions forming the overall matrix. In such a case, the cells in the individual regions are tested by selectively addressing the respective rows and columns. Those instances of the regular rows and columns that are identified as being faulty are, then, replaced with instances of the additional rows and columns that are identified as being fault-free. The replacement can be done conventionally, for example, by laser programming in "fuse banks".

In accordance with a further feature of the invention, the address decoding device has a row address decoder having Z address inputs for receiving Z row address bits, and M+P outputs provided for the M+P row lines in the memory matrix and addressing individual ones of the rows based upon a variable decoding specification changeable between a first decoding specification addressing the M selected rows in the memory matrix utilizing bits received at Z address inputs of the row address decoder and a second decoding specification addressing the remaining set of P rows in the memory matrix utilizing bits received at K preselected ones of the address inputs of the row address decoder, and a column address decoder having S address inputs for receiving S column address bits and N+Q outputs provided for the N+Q column lines in the memory matrix and addressing individual ones of the column lines based upon a variable decoding specification changeable between a first de coding specification addressing the N selected columns in the memory matrix utilizing bits received at the S address inputs of the column address decoder, and a second decoding specification addressing the remaining set of Q columns in the memory matrix utilizing bits received at L preselected ones of the S address inputs of the column address decoder.

In accordance with an added feature of the invention, the changeover device sets the row address decoder and the column address decoder to a respective first decoding specification in the first operating state, sets the row address decoder to the second decoding specification and the column address decoder to the first decoding specification in the second operating state, sets the row address decoder to the first decoding specification and the column address decoder to the second decoding specification in the third operating state, and the row address decoder and the column address decoder to a respective second decoding specification in the fourth operating state.

In accordance with an additional feature of the invention, the changeover device (a) connects the Z+S address connection contacts to the Z+S address inputs of the row address decoder and the column address decoder in the first operating state, (b) connects, in the second operating state, (b1) the K preselected ones of the Z+S address connection contacts excluding the two dedicated contacts to the preselected K inputs of the Z address inputs of the row address decoder and (b2) S preselected other ones of the Z+S address connection contacts excluding the two dedicated contacts to the S address inputs of the column address decoder, (c) connects, in the third operating state, (c1) Z preselected ones of the Z+S address connection contacts excluding the two dedicated contacts to the Z address inputs of the row address decoder and (c2) L preselected other ones of the Z+S address connection contacts excluding the two dedicated contacts to the L preselected ones of the S address inputs of the column address decoder, and (d) connects, in the fourth operating state, (d1) the K preselected ones of the Z+S address connection contacts excluding the two dedicated contacts to the K preselected ones of the Z address inputs of the row address decoder and (d2) the L preselected other ones of the Z+S address connection contacts excluding the dedicated contacts to the L preselected ones of the S address inputs of the column address decoder.

In accordance with yet another feature of the invention, all but one of a first set of the address connection contacts having Z elements are directly connected to Z−1 address inputs of the row address decoder, the one contact of the first set corresponding to a first of the two dedicated contacts dedicated to the second control bit, all but one of a second set of the address connection contacts having S elements are directly connected to S−1 address inputs of the column address decoder, the one contact of the second set corresponding to a second of the two dedicated contacts dedicated to the third control bit, and the changeover device has a first 2:1 multiplexer having a first input connected the first dedicated contact of the first set, a second input connected to one of the contacts in the second set, and an output connected to one of the Z address inputs of the row address decoder not associated with the K preselected ones of the Z+S address connection contacts, a second 2:1 multiplexer having a first input connected to the second dedicated contact of the second set, a second input connected to one of the contacts in the first set, and an output connected to one of the S address inputs of the column address decoder not associated with the L preselected other ones of the Z+S address connection contacts, and a control circuit, based upon a bit pattern of the first, second, and third control bits (a) setting, for the first operating state, the first multiplexer to the first input and the second multiplexer to the first input, (b) setting, for the second operating state, the second multiplexer to the second input, and (c) setting, for the third operating state, the first multiplexer to the second input.

In accordance with yet a further feature of the invention, the control circuit produces, at a first output, a first binary control signal by logically combining the first and second control bits and produces, at a second output, a second binary control signal by logically combining the first and third control bits, the row address decoder has a decoding-specification setting input, the column address decoder has a decoding-specification setting input, the first output of the control circuit is connected to the control input of the second multiplexer and to the decoding-specification setting input of the row address decoder for applying the first control signal to the second multiplexer and to the row address decoder, and the second output of the control circuit is connected to the control input of the first multiplexer and to the decoding-specification setting input of the column address decoder for applying the second control signal to the first multiplexer and to the column address decoder.

In accordance with yet an added feature of the invention, the control circuit has a first AND circuit for generating the first binary control signal and a second AND circuit for generating the second binary control signal.

In accordance with yet an additional feature of the invention, the given first binary value of the first control bit is a logic 0.

In accordance with again another feature of the invention, the information memory and the addressing device are part of an integrated circuit on a single semiconductor chip.

With the objects of the invention in view, there is also provided a method for manufacturing a fault-free digital memory circuit, including the steps of providing a digital circuit configuration according to the invention, the memory matrix having regions, successively testing all of the regions of the memory matrix in any order by setting the first, second, third, and fourth operating states with the changeover device, and replacing the rows and columns in the memory matrix identified as being faulty during testing in terms of function with respective ones of the additional rows and additional columns identified during testing as being fault-free.

With the objects of the invention in view, there is also provided a method for manufacturing a fault-free digital memory circuit, including the steps of providing a digital circuit configuration according to the invention, successively testing the memory matrix in any order by setting the first, second, third, and fourth operating states with the changeover device, and functionally replacing the rows and columns in the memory matrix identified as being faulty during testing with respective ones of the additional rows and additional columns identified during testing as being fault-free.

Other features that are considered as characteristic for the invention are set forth in the appended claims.

Although the invention is illustrated and described herein as embodied in a digital memory circuit and a method for manufacturing the circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Referring now to the figures of the drawings in detail, there is shown, in the top right of the figures, a schematic illustration of a memory matrix 50 containing $M=2^Z$ regular rows ZM(1) to ZM(M), $p=2^K$ additional rows ZP(1) to ZP(P), $N=2^S$ regular columns SN(1) to SN(N) and $Q=2^L$ additional columns SQ(1) to SQ(Q). The names used here for the rows and columns are entered against the respectively associated row and column lines in the drawing. The numbers Z, K, S, L are integers, where $K \leq Z-2$ and $L \leq S-2$.

The M regular rows and the N regular columns define a first region A of the memory matrix. The P additional rows and the N regular columns define a second region B of the memory matrix. The M regular rows and the Q additional columns define a third region C of the memory matrix. The P additional rows and the Q additional columns define a fourth region D of the memory matrix. In the case illustrated, each region is a cohesive block in the matrix. This also simplifies the illustration in the drawing. Alternatively, the regions can be disposed with physical interleaving.

The bundle 51 of the M regular row lines is connected to a first group 41a of M outputs of a row address decoder 41, and the bundle 52 of the P additional row lines is connected to a second group 41b of P outputs of the row address decoder 41. In a similar way, the bundle 53 of the N regular column lines is connected to a first group 42a of N outputs of a column address decoder 42, and the bundle 54 of the Q additional column lines is connected to a second group 42b of Q outputs of the column address decoder 42.

The row address decoder 41 has Z address inputs EZ(1) to EZ(Z) for receiving Z address bits sufficient for addressing the $M=2^Z$ regular rows. The decoder 41 also has a control input CZ for receiving a first binary control signal U1 from a line 35. The decoder 41 is configured to alternate between two column decoding specifications (which are described further below) based upon the control signal U1.

The column address decoder 42 has S address inputs ES(1) to ES(S) for receiving S address bits sufficient for addressing the $N=2^S$ regular columns. The decoder 42 also has a control input CS for receiving a second binary control signal U2 from a line 36. The decoder 42 is configured to alternate between two row decoding specifications (which are described further below) based upon the control signal U2.

There is also a first set 11 of Z address connection contacts AZ(1) to AZ(Z), the first Z−1 instances AZ(1) to AZ(Z−1) of which are hardwired to the first Z−1 instances EZ(1) to EZ(Z−1) of the address inputs of the row address decoder 41. In a similar manner, there is a second set 12 of S address connection contacts AS(1) to AS(S), the first S−1 instances AS(1) to AS(S−1) of which are hardwired to the first S−1 instances ES(1) to ES(S−1) of the address inputs of the column address decoder 42.

The last address input EZ(Z) of the row address decoder 41 can be selectively connected either to the last contact AZ(Z) in the first set 11 of address connection contacts or to the second to last contact AS(S−1) in the second set 12 of address connection contacts by an electronically controlled first changeover switch (multiplexer) 31. The switching state of the changeover switch 31 is controlled by the second binary control signal U2, which appears on the line 36.

In a similar manner, the last address input ES(S) of the column address decoder 42 can be selectively connected either to the last contact AS(S) in the second set 12 of address connection contacts or to the second to last contact AZ(Z−1) in the first set 11 of address connection contacts by an electronically controlled second changeover switch (multiplexer) 32. The switching state of the changeover switch 32 is controlled by the first binary control signal U1, which appears on the line 35.

For generating the two control signals U1 and U2, a separate connection contact 13 in the form of a control bit connection AC for externally applying a first control bit C1, and a combinational logic circuit having two AND gates 33 and 34, each of which can be formed by a NAND gate with a downstream inverter, for example, are provided. The input side of the first AND gate 33 is connected to the control bit connection contact AC and to the last contact AZ(Z) in the first set 11 of address connection contacts, and the output side of the AND gate 33 puts the control signal U1 onto the line 35. The input side of the second AND gate 34 is connected to the control bit connection contact AC and to the last contact AS(S) in the second set 12 of address connection contacts, and the output side of the AND gate 34 puts the control signal U2 onto the line 36.

The whole of the circuit configuration described above is preferably in the form of an integrated circuit on a single chip. The way in which the circuit works for addressing the various regions A, B, C, and D of the matrix 50 will now be explained with reference to FIGS. 1 to 4.

Selecting Matrix Region A

Figure 1:
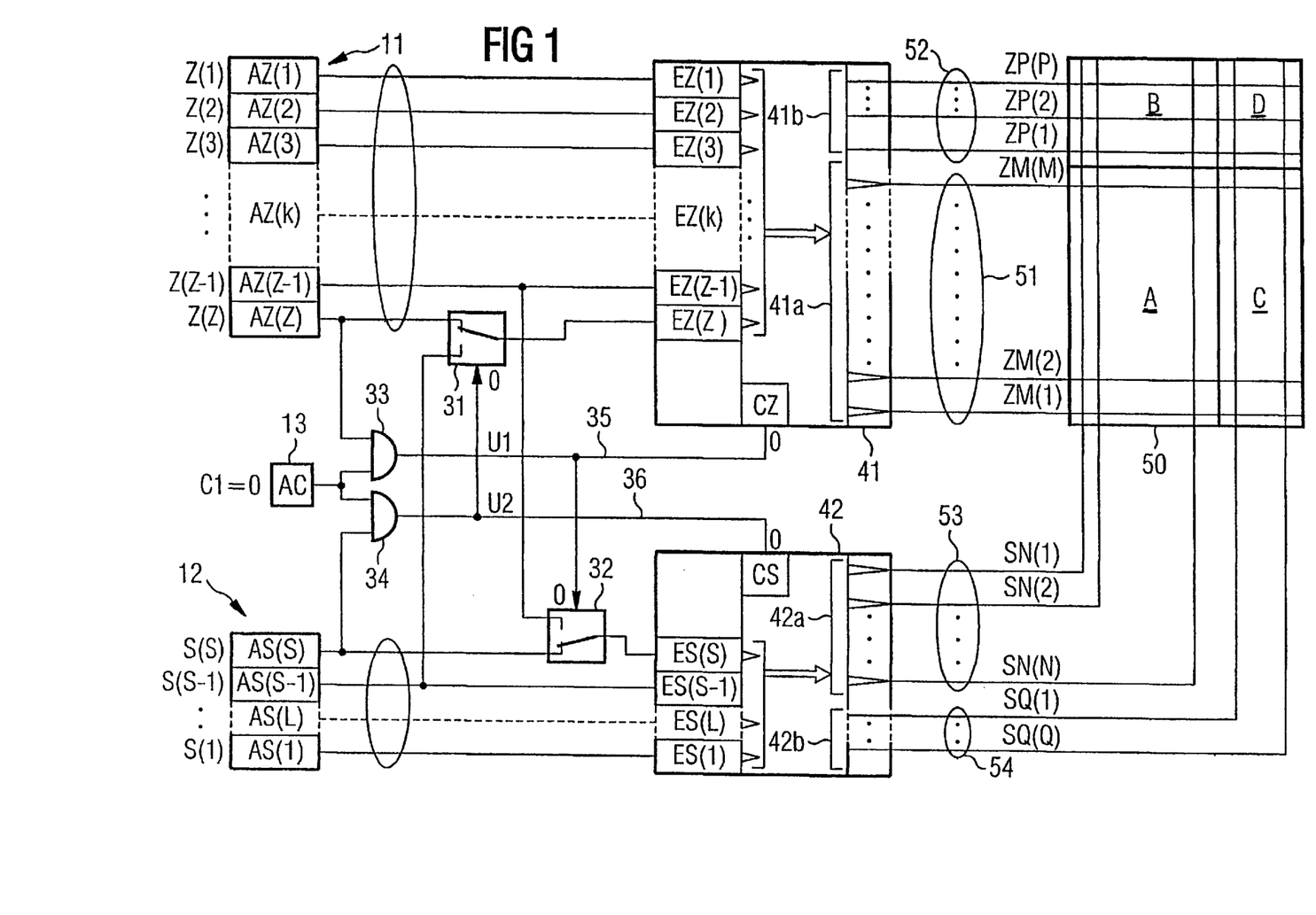
FIGS. 1 to 4 are schematic and block circuit diagrams of a preferred embodiment of a circuit configuration according to the invention in four different operating states.

To address the M regular rows and N regular columns that define the region A of the memory matrix 50, the binary value "0" is applied to the control bit connection contact AC to set a first operating state, which is shown in FIG. 1.

The "0" of the "first control bit" C1 on the contact AC sets the first control signal U1 to "0" through the first AND gate 33 and sets the second control signal likewise to "0" through the second AND gate 34.

In response to the binary value "0" of the second control signal U2, the first changeover switch 31 connects the last address input EZ(Z) of the row address decoder 41 to the last address connection contact AZ(Z) in the set 11, and, in response to the binary value "0" of the first control signal U1, the row address decoder 41 is set to a first row "decoding specification" (through its input CZ). This means that, in such a setting, the decoder 41 uses all Z bits applied to its address inputs EZ(1) to EZ(Z) for addressing the M regular rows ZM(1) to ZM(M) of the memory matrix 50.

In a similar manner, in response to the binary value "0" of the first control signal U1, the second changeover switch 32 connects the last address input ES(S) of the column address decoder 42 to the last address connection contact AS(S) in the set 12, and, in response to the binary value "0" of the second control signal U2, the column address decoder 42 is set to a first column decoding specification (through its input CS). In such a setting, the decoder 42 uses all S bits applied to its address inputs ES(1) to ES(S) for addressing the N regular columns ZN(1) to ZN(N) of the memory matrix 50.

In the circuit configuration's first operating state, as so defined, the row address bits Z(1) to Z(Z) required for addressing the M regular rows are applied to the address connection contacts AZ(1) to AZ(Z) in the first set 11, and the column address bits S(1) to S(S) required for addressing the N regular columns are applied to the address connection contacts AS(1) to AS(S) in the second set 12.

Selecting Matrix Region B

Figure 2:
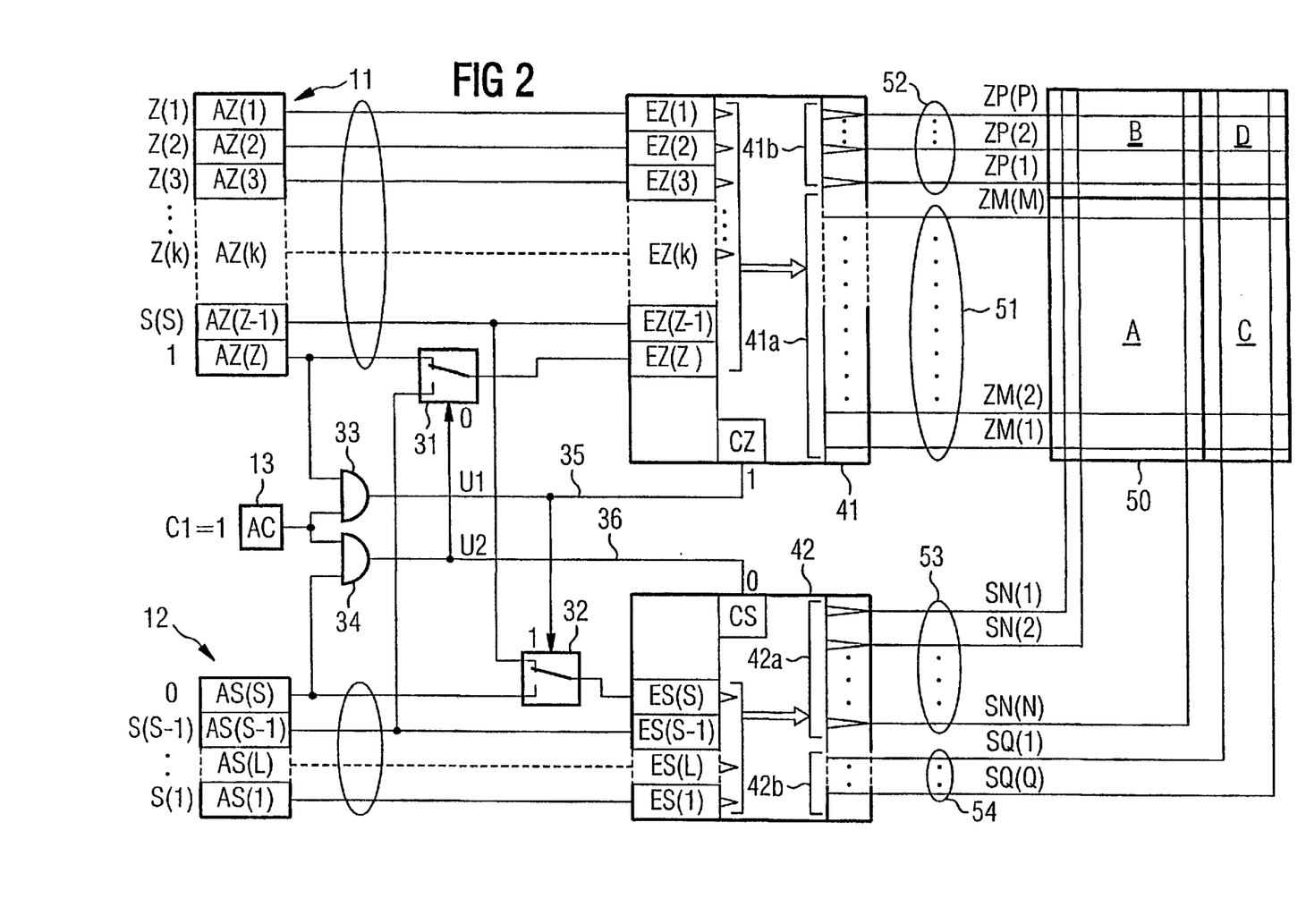

To address the P additional rows and N regular columns that define the region B of the memory matrix 50, a second operating state as shown in FIG. 2 is set by setting the first control bit C1 on the contact AC to the binary value "1", applying a "1" as second control bit to the last address connection contact AZ(Z) in the first set 11, and applying a "0" as third control bit to the last address connection contact AS(S) in the second set 12.

In such a case, the first AND gate 33 receives a "1" at both inputs, which means that the first control signal U1 is set to "1". The second control signal U2 is set to "0", because the AND gate receives a "0" at one input.

In response to the binary value "0" of the second control signal U2, the first changeover switch 31 connects the last address input EZ(Z) of the row address decoder 41 to the last address connection contact AZ(Z) in the set 11 (this connection is not actually needed in the second operating state of the circuit configuration, but its appearance can be attributed to the nature of the changeover switch used). In response to the binary value "1" of the first control signal U1, the row address decoder 41 is set to a second row decoding specification (through its input CZ). In such a setting, the decoder 41 uses only K≦Z−2 bits applied to its address inputs EZ(1) to EZ(K) for addressing the P additional rows ZP(1) to ZP(P) of the memory matrix 50.

In response to the binary value "1" of the first control signal U1, the second changeover switch 32 connects the last address input ES(S) of the column address decoder 42 to the second to last address connection contact AZ(Z−1) in the set 11, and, in response to the binary value "0" of the second control signal U2, the column address decoder 42 is set to the first column decoding specification (through its input CS). In such a setting, the decoder 42 uses, as mentioned, all S bits applied to its address inputs ES(1) to ES(S) for addressing the N regular columns ZN(1) to ZN(N) of the memory matrix 50.

In the circuit configuration's second operating state, as so defined, the K row address bits Z(1) to Z(K) required for addressing the P additional rows are applied to the address connection contacts AZ(1) to AZ(K) in the first set 11, and the S row address bits S(1) to S(S) required for addressing the N regular columns are applied to the address connection contacts AS(1) to AS(S−1) in the second set 12 and to the second to last address connection contact AZ(Z−1) in the first set.

Selecting Matrix Region C

Figure 3:
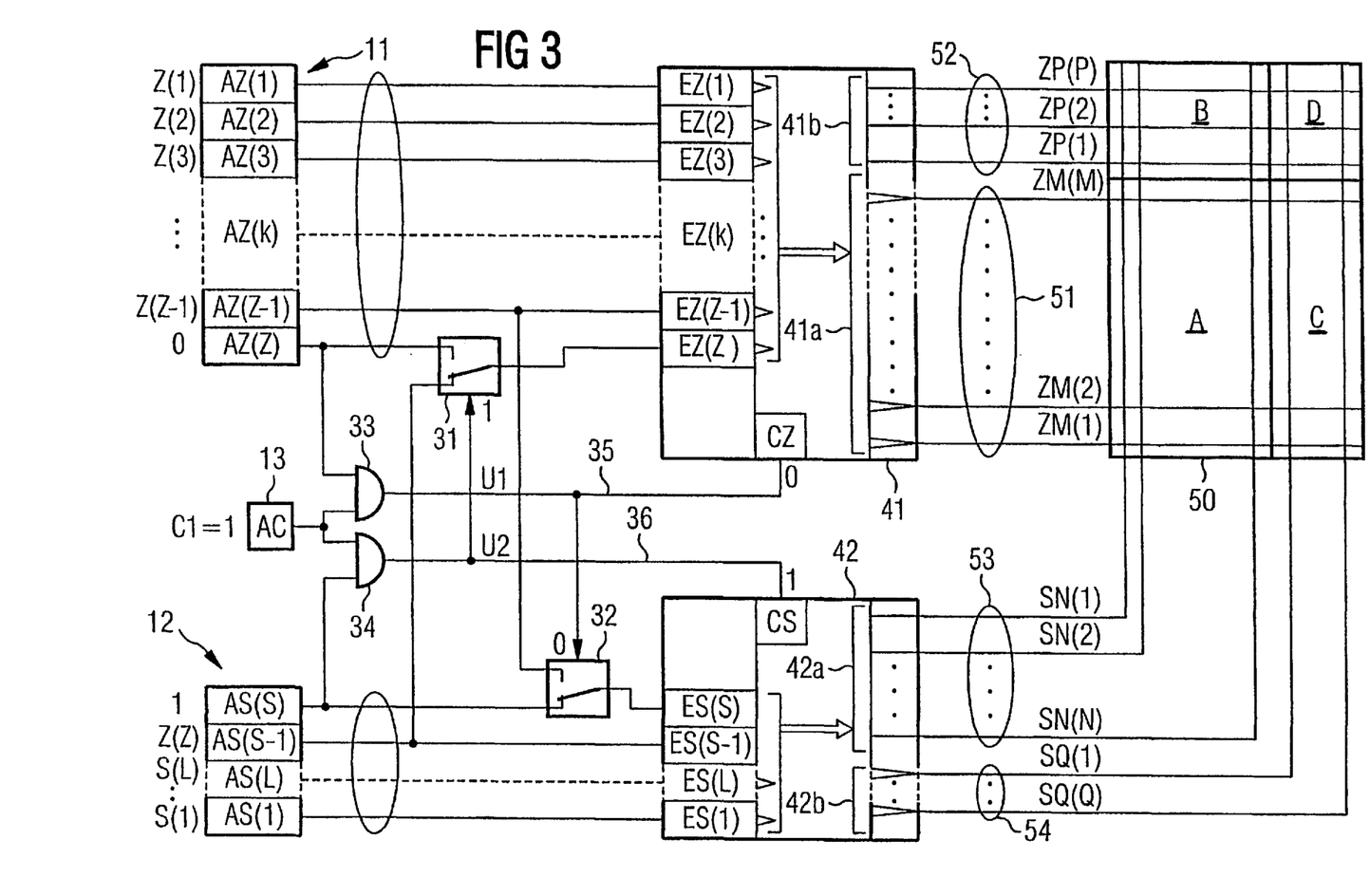

To address the M regular rows and the Q additional columns that define the region C of the memory matrix 50, a third operating state as shown in FIG. 3 is set by setting the first control bit C1 on the contact AC to the binary value "1", applying a "0" as second control bit to the last address connection contact AZ(Z) in the first set 11, and applying a "1" as third control bit to the last address connection contact AS(S) in the second set 12.

In such a case, the first AND gate 33 receives a "0" at one input, which means that the first control signal U1 is set to "0". The second control signal U2 is set to "1", because the second AND gate 34 receives a "1" at both inputs.

In response to the binary value "1" of the second control signal U2, the first changeover switch 31 connects the last address input EZ(Z) of the row address decoder 41 to the second to last address connection contact AS(S−1) in the set 12, and, in response to the binary value "0" of the first control signal U1, the row address decoder 41 is set to the first row decoding specification (through its input CZ). In such a setting, the decoder 41 uses, as mentioned, all Z bits applied to its address inputs EZ(1) to EZ(Z) for addressing the M regular rows ZM(1) to ZM(M) of the memory matrix 50.

In response to the binary value "0" of the first control signal U1, the second changeover switch 32 connects the last address input ES(S) of the column address decoder 42 to the last address connection contact AS(S) in the set 12 (this connection is not actually needed in the third operating state of the circuit configuration, but its appearance can be attributed to the nature of the changeover switch used). In response to the binary value "1" of the second control signal U2, the column address decoder 42 is set to a second column decoding specification (through its input CS). In such a setting, the decoder 42 uses only the L≦S−2 bits applied to its address inputs ES(1) to ES(L) for addressing the Q additional columns SQ(1) to AQ(Q) of the memory matrix 50.

In the circuit configuration's third operating state, as so defined, the L row address bits Z(1) to S(L) required for addressing the Q additional columns are applied to the L address connection contacts AS(1) to AS(L) in the second set 12, and the Z row address bits Z(1) to Z(Z) required for addressing the M regular rows are applied to the address connection contacts AZ(1) to AZ(Z−1) in the first set 11 and to the second to last address connection contact AS(S−1) in the second set 12.

Selecting Matrix Region D

Figure 4:
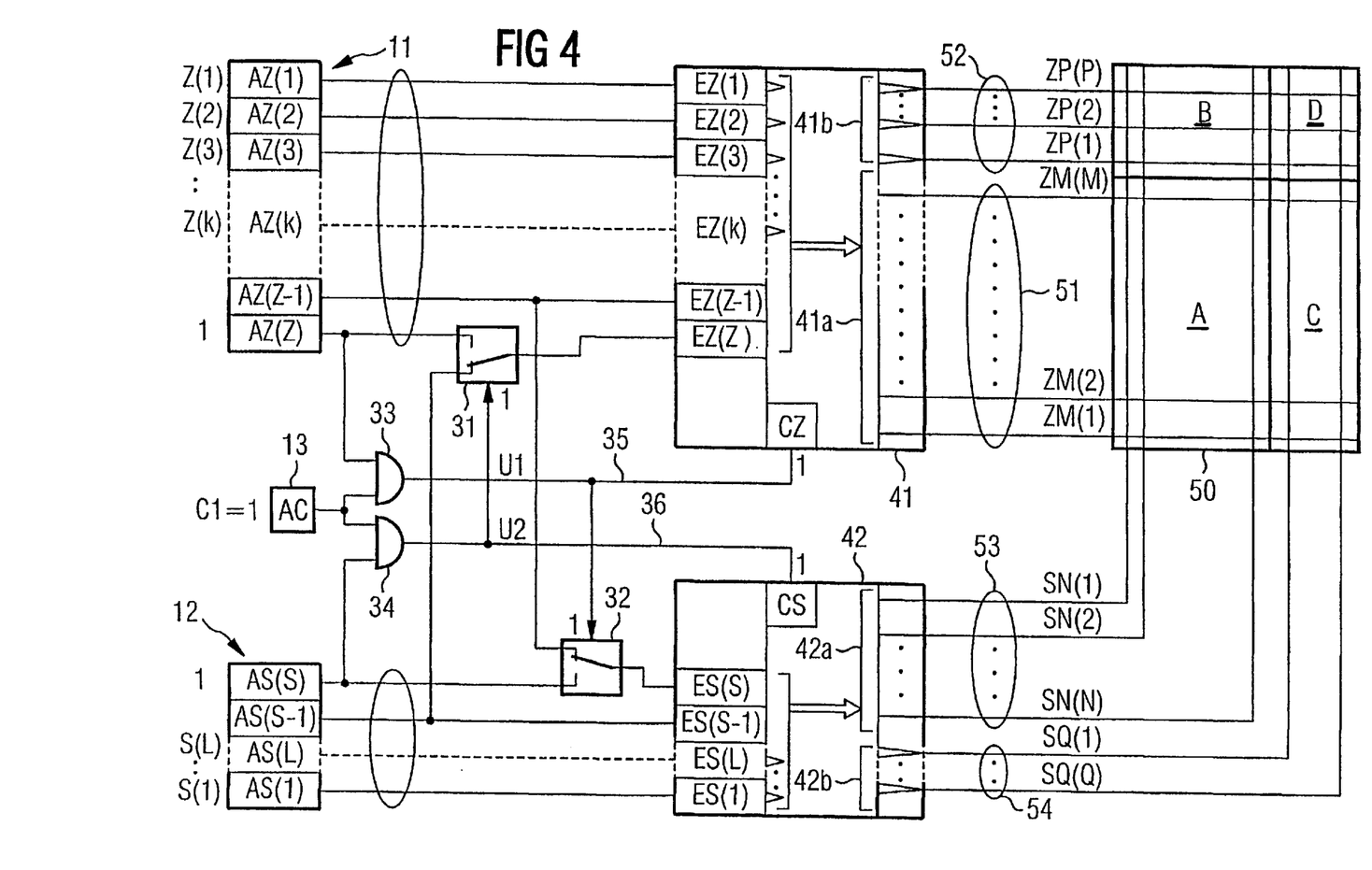

To address the P additional rows and the Q additional columns that define the region D of the memory matrix 50, a fourth operating state as shown in FIG. 4 is set by setting the first control bit C1 on the contact AC to the binary value "1", applying a "1" as second control bit to the last address connection contact AZ(Z) in the first set 11, and applying a "1" as third control bit to the last address connection contact AS(S) in the second set 12.

In such a case, the first AND gate 33 receives a "1" at both inputs, which means that the first control signal U1 is set to "1". The second control signal U2 is, likewise, set to "1" because the AND gate 34 also receives a "1" at both inputs.

In response to the binary value "1" of the second control signal U2, the first changeover switch 31 naturally connects the last address input EZ(Z) of the row address decoder 41 to the second to last address connection contact AS(S−1) in the set 12 (although this connection is not needed in this case). In response to the binary value "1" of the first control signal U1, the row address decoder 41 is set to the second row decoding specification (through its input CZ). In such a setting, the decoder 41 uses, as mentioned, only K bits applied to its K address inputs EZ(1) to EZ(K) for addressing the P additional rows ZP(1) to ZP(P) of the memory matrix 50.

In response to the binary value "1" of the first control signal U1, the second changeover switch 32 naturally connects the last address input ES(S) of the column address decoder 42 to the second to last address connection contact AZ(Z−1) in the set 11 (although this connection is also not needed in this case). In response to the binary value "1" of the second control signal U2, the column address decoder 42 is set to the second column decoding specification (through its input CS). In such a setting, the decoder 42 uses, as mentioned, only L bits applied to its address inputs ES(1) to ES(L) for addressing the Q additional columns SQ(1) to AQ(Q) of the column matrix 50.

In the circuit configuration's fourth operating state, as so defined, the K row address bits Z(1) to Z(K) required for addressing the P additional rows are applied to the address connection contacts AZ(1) to AZ(K) in the first set 11, and the L row address bits Z(1) to S(L) required for addressing the Q additional columns are applied to the L address connection contacts AS(1) to AS(L) in the second set 12.

The ordinate numbers used in the above description and in the figures and also indicated in brackets for the various address bits, address connection contacts, and decoding inputs, preferably (even though not necessarily) correspond to the respective ordinate number for the place value of the bits in question. That is to say, that "first" is associated with the lowest bit place value, and "last" is associated with the highest bit place value.

As can be seen from the description above and from the figures of the drawing, the way in which the address bits of the regular rows and columns are distributed over the address connection contacts changes for different operating states. The additional involvement for the relevant reordering of the address bits can be moved to the external assembly, which is connected upstream of the address connection contacts during operation and can be configured to perform suitable address scrambling.

Following testing of the memory cells in all the matrix regions by setting the four operating states described above and following programming of the fuse banks for replacing faulty instances of the regular rows/columns with fault-free instances of the additional rows/columns, the circuit configuration can be used normally as a memory circuit with a fault-free M-times-N matrix, specifically, in the first operating state as shown in FIG. 1, where the control bit connection contact is permanently held at "0". Alternatively, a further subsequent processing operation on the chip can also be used to provide for the changeover device to be completely isolated in terms of its function and for a permanent state to be set up instead, in which the switched connections shown in FIG. 1 exist between the address connection contacts and the decoder inputs and in which the decoders are set to their respective first decoding specification (as shown in FIG. 1). This has the advantage that the control bit connection contact can subsequently be wired for other purposes on the chip so that it may be possible to dispense with a wide "pad" that would otherwise need to be available for such further purposes.

On the other hand, however, it can be useful to retain the changeover device's operability while the memory circuit is being used as well. It is, thus, possible, by accessing the control bit connection contact, to write and read additional information to/from memory cells in (fault-free) instances of the additional rows and columns of the memory matrix. Such information can be, by way of example, security information that is intended to be available only to those users for whom access to the control bit connection contact is specifically possible.

We claim:

1. A digital circuit configuration, comprising:
    an information memory having cells forming a memory matrix (50) with:
        M rows;
        N columns;
        P additional rows; and
        Q additional columns, where:
            P<M;
            Q<N;
            P has K≦(Z-2) bits for addressing P elements; and
            Q has L≦(S-2) bits for addressing Q elements;
    an addressing device having:
        an address decoding device having inputs;
    an input circuit having:
        address connection contacts for receiving externally applied row and column address bits, a number of said address connection contacts being equal to a sum Z+S, where Z is a number of bits required for addressing M elements and S is a number of bits required for addressing N elements;
        a control bit connection contact for receiving an externally applied first control bit; and
        a changeover device receiving:
            the first control bit; and
            second and third control bits respectively applied to two dedicated contacts of said address connection contacts;
        a device for transferring at least some of said applied address bits to said inputs of said address decoding device; and
    said changeover device:
        only when the first control bit has a given first binary value, setting a first operating state in which said address decoding device uses bits of all of said address connection contacts for addressing M selected rows and N selected columns in said memory matrix; and
        otherwise, depending on a given combination of values of the second and third control bits, selectively setting one of a second operating state, a third operating state, and a fourth operating state in which said address decoding device, respectively, uses bits from contacts of ones of said address connection contacts not dedicated to the second and third control bits for addressing:
            M selected rows and a remaining set of Q columns;
            a remaining set of P rows and N selected columns; and
            a remaining set of P rows and a remaining set of Q columns.

2. The circuit configuration according to claim 1, wherein at least one of the variables M, N, P, and Q are set according to the following relationships:

$M=2^Z$;
$N=2^S$;
$P=2^K$; and
$Q=2^L$.

3. The circuit configuration according to claim 1, wherein $M=2^Z$.

4. The circuit configuration according to claim 1, wherein $N=2^S$.

5. The circuit configuration according to claim 1, wherein $P=2^K$.

6. The circuit configuration according to claim 1, wherein $Q\ 2^L$.

7. The circuit configuration according to claim 1, wherein said address decoding device has:
    a row address decoder having:
        Z address inputs for receiving Z row address bits; and
        M+P outputs provided for said M+P row lines in said memory matrix and addressing individual ones of said rows based upon a variable decoding specification changeable between:
            a first decoding specification addressing said M selected rows in said memory matrix utilizing bits received at Z address inputs of said row address decoder; and
            a second decoding specification addressing said remaining set of P rows in said memory matrix utilizing bits received at K preselected ones of said address inputs of said row address decoder; and
    a column address decoder having:
        S address inputs for receiving S column address bits; and
        N+Q outputs provided for said N+Q column lines in said memory matrix and addressing individual ones of said column lines based upon a variable decoding specification changeable between:
            a first decoding specification addressing said N selected columns in said memory matrix utilizing bits received at said S address inputs of said column address decoder; and
            a second decoding specification addressing said remaining set of Q columns in said memory matrix utilizing bits received at L preselected ones of said S address inputs of said column address decoder.

8. The circuit configuration according to claim 7, wherein said changeover device:
    sets said row address decoder and said column address decoder to a respective first decoding specification in said first operating state;
    sets said row address decoder to said second decoding specification and said column address decoder to said first decoding specification in said second operating state;
    sets said row address decoder to said first decoding specification and said column address decoder to said second decoding specification in said third operating state; and
    said row address decoder and said column address decoder to a respective second decoding specification in said fourth operating state.

9. The circuit configuration according to claim 8, wherein said changeover device:
    a) connects said Z+S address connection contacts to said Z+S address inputs of said row address decoder and said column address decoder in said first operating state;

b) connects, in said second operating state:
   b1) said K preselected ones of said Z+S address connection contacts excluding said two dedicated contacts to said preselected K inputs of said Z address inputs of said row address decoder; and
   b2) S preselected other ones of said Z+S address connection contacts excluding said two dedicated contacts to said S address inputs of said column address decoder;
c) connects, in said third operating state:
   c1) Z preselected ones of said Z+S address connection contacts excluding said two dedicated contacts to said Z address inputs of said row address decoder; and
   c2) L preselected other ones of said Z+S address connection contacts excluding said two dedicated contacts to said L preselected ones of said S address inputs of said column address decoder; and
d) connects, in said fourth operating state:
   d1) said K preselected ones of said Z+S address connection contacts excluding said two dedicated contacts to said K preselected ones of said Z address inputs of said row address decoder; and
   d2) said L preselected other ones of said Z+S address connection contacts excluding said dedicated contacts to said L preselected ones of said S address inputs of said column address decoder.

10. The circuit configuration according to claim 9, wherein:
   all but one of a first set of said address connection contacts having Z elements are directly connected to Z−1 address inputs of said row address decoder, said one contact of said first set corresponding to a first of said two dedicated contacts dedicated to the second control bit;
   all but one of a second set of said address connection contacts having S elements are directly connected to S−1 address inputs of said column address decoder, said one contact of said second set corresponding to a second of said two dedicated contacts dedicated to the third control bit; and
   said changeover device has:
      a first 2:1 multiplexer having:
         a first input connected said first dedicated contact of said first set;
         a second input connected to one of said contacts in said second set; and
         an output connected to one of said Z address inputs of said row address decoder not associated with said K preselected ones of said Z+S address connection contacts;
      a second 2:1 multiplexer having:
         a first input connected to said second dedicated contact of said second set;
         a second input connected to one of said contacts in said first set; and
         an output connected to one of said S address inputs of said column address decoder not associated with said L preselected other ones of said Z+S address connection contacts; and
      a control circuit, based upon a bit pattern of the first, second, and third control bits:
         a) setting, for said first operating state, said first multiplexer to said first input and said second multiplexer to said first input;
         b) setting, for said second operating state, said second multiplexer to said second input; and
         c) setting, for said third operating state, said first multiplexer to said second input.

11. The circuit configuration according to claim 10, wherein:
   said control circuit:
      produces, at a first output, a first binary control signal by logically combining the first and second control bits; and
      produces, at a second output, a second binary control signal by logically combining the first and third control bits;
   said row address decoder has a decoding-specification setting input;
   said column address decoder has a decoding-specification setting input;
   said first output of said control circuit is connected to said control input of said second multiplexer and to said decoding-specification setting input of said row address decoder for applying said first control signal to said second multiplexer and to said row address decoder, and
   said second output of said control circuit is connected to said control input of said first multiplexer and to said decoding-specification setting input of said column address decoder for applying said second control signal to said first multiplexer and to said column address decoder.

12. The circuit configuration according to claim 11, wherein said control circuit has:
   a first AND circuit for generating said first binary control signal; and
   a second AND circuit for generating said second binary control signal.

13. The circuit configuration according to claim 12, wherein the given first binary value of the first control bit is a logic 0.

14. The circuit configuration according to claim 1, wherein said information memory and said addressing device are part of an integrated circuit on a single semiconductor chip.

15. A method for manufacturing a fault-free digital memory circuit, which comprises:
   providing a digital circuit configuration according to claim 1, the memory matrix having regions;
   successively testing all of the regions of the memory matrix in any order by setting the first, second, third, and fourth operating states with the changeover device; and
   replacing the rows and columns in the memory matrix identified as being faulty during testing in terms of function with respective ones of the additional rows and additional columns identified during testing as being fault-free.

16. A method for manufacturing a fault-free digital memory circuit, which comprises:
   providing a digital circuit configuration according to claim 1;
   successively testing the memory matrix in any order by setting the first, second, third, and fourth operating states with the changeover device; and
   functionally replacing the rows and columns in the memory matrix identified as being faulty during testing with respective ones of the additional rows and additional columns identified during testing as being fault-free.

17. A circuit, comprising:
a single semiconductor chip having an integrated circuit with:
an information memory having cells forming a memory matrix with:
M rows;
N columns;
P additional rows; and
Q additional columns, where:
P<M;
Q<N;
P has $K \leq (Z-2)$ bits for addressing P elements; and
Q has $L \leq (S-2)$ bits for addressing Q elements;
an addressing device having:
an address decoding device having inputs;
an input circuit having:
address connection contacts for receiving externally applied row and column address bits, a number of said address connection contacts being equal to a sum Z+S, where Z is a number of bits required for addressing M elements and S is a number of bits required for addressing N elements;
a control bit connection contact for receiving an externally applied first control bit; and
a changeover device receiving:
the first control bit; and
second and third control bits respectively applied to two dedicated contacts of said address connection contacts;
a device for transferring at least some of said applied address bits to said inputs of said address decoding device; and
said changeover device:
only when the first control bit has a given first binary value, setting a first operating state in which said address decoding device uses bits of all of said address connection contacts for addressing M selected rows and N selected columns in said memory matrix; and
otherwise, depending on a given combination of values of the second and third control bits, selectively setting one of a second operating state, a third operating state, and a fourth operating state in which said address decoding device, respectively, uses bits from contacts of ones of said address connection contacts not dedicated to the second and third control bits for addressing:
M selected rows and a remaining set of Q columns;
a remaining set of P rows and N selected columns; and
a remaining set of P rows and a remaining set of Q columns.

* * * * *